United States Patent [19]

Nakata

[11] 4,152,711
[45] May 1, 1979

[54] SEMICONDUCTOR CONTROLLED LUMINESCENT DEVICE

[75] Inventor: Josuke Nakata, Itami, Japan

[73] Assignee: Mitsubishi Denki Kabuchiki Kaisha, Tokyo, Japan

[21] Appl. No.: 781,462

[22] Filed: Mar. 25, 1977

[30] Foreign Application Priority Data

Apr. 1, 1976 [JP] Japan .................................. 51-36354
Jul. 28, 1976 [JP] Japan .................................. 51-90646

[51] Int. Cl.² ............................................ H01L 29/80
[52] U.S. Cl. ...................................... 357/17; 357/18; 357/22
[58] Field of Search ............................. 357/17, 18, 22

[56] References Cited

U.S. PATENT DOCUMENTS

| 3,447,044 | 5/1969 | Sandbank | 317/234 |
| 3,492,548 | 1/1970 | Goodman | 317/235 |
| 3,508,111 | 4/1970 | Davidson | 315/169 |
| 3,894,295 | 7/1975 | Shannon | 357/19 |

Primary Examiner—Martin H. Edlow
Attorney, Agent, or Firm—Wenderoth, Lind, Ponack

[57] ABSTRACT

A p type semiconductor gate layer is buried in an N type semiconductor cathode layer to encircle a channel through which the forward current of a luminescent PN junction passes. A reverse voltage is applied to the gate layer to spread a depletion layer in the channel to control the forward current and therefore the emission of light. The gate layer may be disposed on that surface of the cathode layer remote from the luminescent PN junction with a groove disposed the other surface of the cathode layer to narrow the channel.

11 Claims, 18 Drawing Figures

SEMICONDUCTOR CONTROLLED LUMINESCENT DEVICE

BACKGROUND OF THE INVENTION

This invention relates to a semiconductor luminescent device including a control electrode.

Semiconductor luminescent diodes emit light by a forward current flow through the PN junction involved. In order to control the luminescent output from a luminescent, it is required to externally connect a switch element such as a transistor or a variable impedance element to each semiconductor luminescent diode. Such a switch element has an inherent power loss and is required to have a current rating similar to that of the corresponding semiconductor luminescent diode. Thus the conventional semiconductor luminescent diodes are disadvantageous because the control of their luminescent output is expensive.

There have been already known luminescent elements including a control electrode for control of the luminescent output, for example, luminescent switching elements having a four layer PNPN structure and the control or gate electrode disposed in ohmic contact with either one of the intermediate layers to be formed into a thyristor configuration. Once such an element has been turned on with an associated source of direct current connected thereacross, it continues to remain on to emit light unless the current decreases to less than the holding current. This means that the control of the luminescent output requires a transistor or another variable impedance element for externally controlling the on-state or forward current.

It is an object of the present invention to provide a novel semiconductor controlled luminescent device.

It is another object of the present invention to provide a new and improved semiconductor controlled luminescent device including an extremly simple control circuit.

It is still another object of the present invention to provide a new and improved semiconductor controlled luminescent device controlled with low power loss.

It is a further object of the present invention to provide a new and improved semiconductor controlled luminescent device having an extremly high control speed.

SUMMARY OF THE INVENTION

The present invention is a semiconductor controlled luminescent device comprising a semiconductor substrate having a surface and including a luminescent junction, an anode electrode and a cathode electrode disposed in ohmic contact with different surface portions of the semiconductor substrate on the different portions of said luminescent junction, voltage applying means for applying a voltage across the anode and cathode electrodes to cause a current to flow from the anode electrode to the cathode electrode through the luminescent junction, and control means for forming a depletion region in a predetermined portion spaced away from the luminescent junction within the semiconductor substrate, the control means being responsive to an externally applied control voltage to change a dimension of the depletion region to control the cross sectional area of the current passageway through which the current from the anode electrode flows to the cathode electrode.

In a preferred embodiment of the present invention, the control means may comprise a control region disposed within the semiconductor substrate to form a PN junction, and responsive to a reverse voltage applied across the PN junction to form a depletion region for controlling the cross sectional area of the current passageway.

In another preferred embodiment of the present invention, the semiconductor controlled luminescent device may comprise an N type semiconductor cathode layer including a pair of opposite main faces, a P type semiconductor anode layer disposed on one portion of one of the main faces of the N type semiconductor cathode layer to form a luminescent PN junction therebetween, a P type semiconductor gate layer disposed to face that portion of the current passageway for the forward current through the luminescent PN junction located in a parallel relationship with the main surface of the N type semiconductor cathode layer within the latter, the P type semiconductor gate layer forming a gate PN junction with the N type semiconductor cathode layer, a cathode electrode disposed in ohmic contact with the N type semiconductor cathode layer to encircle the P type semiconductor anode layer with a predetermined spacing, an anode electrode disposed in ohmic contact with the P type semiconductor anode layer, a gate electrode disposed in ohmic contact with the P type semiconductor gate layer, and a control means for applying a reverse voltage across the gate PN junction to spread the depletion layer in the current passageway for controlling the forward current flowing through the luminescent PN junction depending upon the spread of the depletion layer.

In order to completely control the forward current flowing through the luminescent PN junction, a groove may be advantageously disposed on the surface of the N type semiconductor cathode layer at a position where the current passageway for the forward current flowing through the luminescent PN junction runs in a parallel relationship with the main surface of the N type semiconductor cathode layer, to thereby narrow the current passageway.

BRIEF DESCRIPTION OF THE DRAWINGS

The present invention will become more readily apparent from the following detailed description taken in conjunction with the accompanying drawings in which.

Throughout the Figures like reference numerals designate the identical or similar components.

DESCRIPTION OF THE PREFERRED EMBODIMENTS

Figure 1:
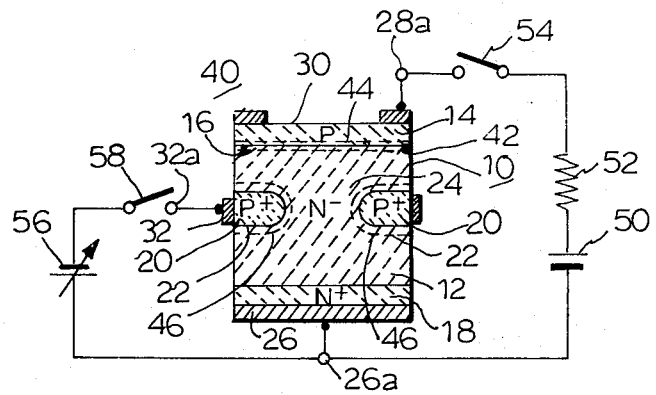
FIG. 1 is a longitudinal sectional view of a semiconductor controlled luminescent element according to the principles of the present invention and a wiring diagram of a control circuit therefor.

Referring now to the drawings and FIG. 1 in particular, there is illustrated a semiconductor controlled luminescent element according to the principles of the present invention having an externally connected control circuit. The arrangement illustrated comprises a substrate of semiconductor material such as, in this case, gallium arsenide (GaAs) generally designated by reference numeral 10 including a central semiconductor layer 12 having a high resistivity or a low impurity concentration and an N− type conductivity, a P type semiconductor layer 14 exposed to one of the opposite main surfaces, in this case, the upper main face as viewed in FIG. 1 of the substrate 10 and contacted by the N− type semiconductor layer 12 to form a PN junction 16 therebetween, and an N+ type semiconductor layer 18 having a low resitivity or a high impurity concentration, exposed to the other or lower main face of the substrate 10 and contacted by the substrate. The P type semiconductor layer 14 forms a semiconductor layer on the anode side or a semiconductor anode layer and the N+ type semiconductor layer 18 forms a semiconductor layer on the cathode side or a semiconductor cathode layer. The PN junction 16 forms a luminescent PN junction for luminescence. Further a P+ type semiconductor layer 20 in the form of an annulus is disposed within the N− type semiconductor layer 12 forms a gate PN junction 22 therebetween and also encircles a channel 24 extending between the P+ type semiconductor layer 14 and the N+ type semiconductor layer 18. The annular P+ type semiconductor gate layer 20 has a low resistivity or a high impurity concentration and forms a semiconductor layer on the gate side or a semiconductor gate layer.

As shown in FIG. 1, a cathode electrode 26 is disposed in ohmic contact with the N+ type semiconductor cathode layer 18 and, an anode electrode 28 is disposed in ohmic contact with the P type semiconductor anode layer 14 opposite to the cathode electrode 26 and includes a central window 30 for external radiation of light emitted adjacent to the luminescent PN junction 16. Also a gate electrode 32 in the form of an annulus is disposed in ohmic contact with the annular P+ type semiconductor gate layer 20.

From FIG. 1 it is seen that the arrangement of the semiconductor controlled luminescent element of the present invention generally designated by the reference numeral 40 is basically identical to conventional semiconductor luminescent diodes except for the P+ type semiconductor layer 20 forming the gate junction 24 with the adjacent semiconductor layer 12 and the gate electrode 32.

It is to be understood that the semiconductor substrate may formed of any luminescent semiconductor other than gallium arsenide.

In order to operate the semiconductor controlled luminescent element 40, a main source of direct current 50 is connected across the anode and cathode electrode 28 and 26 respectively through a current limiting resistor 52, and a switch 54, an anode terminal 28a, and a cathode terminal 26a so that the voltage applied across both electrodes so as to render the anode terminal 28a positive with respect to the cathode terminal 26a. Also a gate source 56 of direct current shown as being of a variable voltage type is connected between a gate terminal 30a connected to the gate electrode 30 and the cathode terminal 26a through a switch 58, so that the voltage applied to the terminals 30a and 24a renders the gate terminal 30a negative with respect to the cathode terminal 26a. That is, the gate PN junction 22 is reversely biased.

Figure 2:
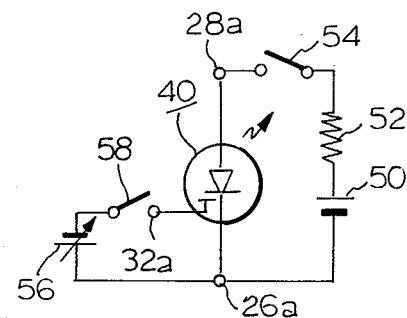
FIG. 2 is a diagram of an equivalent circuit to the arrangement shown in FIG. 1 wherein the controlled luminescent element is shown by the conventional symbol designating the same.

The arrangement of FIG. 1 has an equivalent circuit as shown in FIG. 2 wherein the semiconductor controlled luminescent element 40 is shown by the conventional symbol.

In the arrangement of FIG. 1 with the switches 54 and 58 maintained in their open position, a depletion layer is formed on either side of each of the PN junctions 16 and 22 in accordance with the diffusion potential developed in thermal equilibrium. In FIG. 1 broken lines 42 and 44 designate the respective end surfaces of the depletion layer spread in the N− type semiconductor layer 12 and the P type semiconductor anode layer 14 about the PN junction 16 while broken line 46 designates an end surface of the depletion layer spread in the layer 12 adjacent to the gate PN junction 22.

Figure 3A:
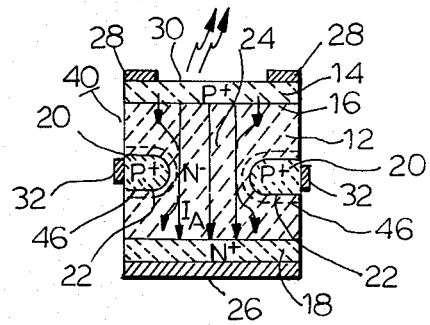
FIGS. 3A, 3B and 3C are longitudinal sectional views useful in explaining the operational principles of the present invention.

In the arrangement of FIG. 1, when the switch 56 remains in its open position while the switch 54 is closed to apply a forward voltage across the anode electrode 28 and cathode electrode 26 a forward current flows through the substrate 10 from the anode electrode to the cathode electrode as shown by the arrows in FIG. 3A. Due to the absence of an external voltage applied to the gate electrode 32, the depletion layer 46 has a small spread adjacent to the gate PN junction 22. Therefore the channel 24 encircled by the semiconductor gate layer 20 within the N− type semiconductor layer 12 is substantially equal to that in the arrangement of FIG. 1. That is, the channel 24 remains open.

Therefore a forward current $I_A$ flows through the substrate 10 from the anode 28 to the cathode electrode 26 as shown at the arrows in FIG. 3A to emit light in the vicinity of the PN junction 16 from luminescence due to the recombination of excessive holes and electrons. The light thus emitted is radiated externally through the window 30 on the anode electrode 28.

With the gate terminal 32a maintained open, the quantity of light emitted is limited by the resistance of the resistor 52 and the voltage across the main source 50 as in conventional semiconductor luminescent diodes.

Figure 3B:
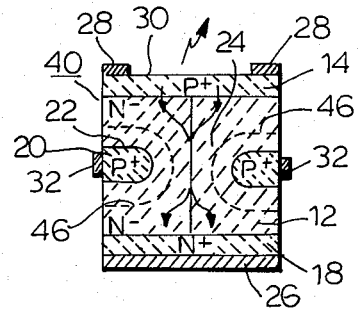

When a voltage less than the cutoff voltage required for cutting off the forward current in the arrangement is applied to the gate electrode 32, the depletion layer 46 located around the annular gate layer 20 spreads into the N− type semiconductor layer 12 until its opposite end portions approach each other as shown in FIG. 3B.

Figure 3C:
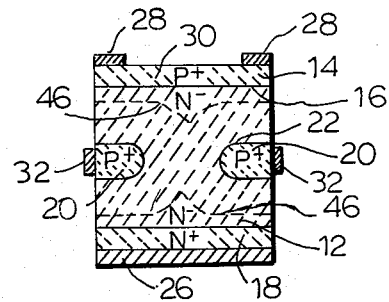

With the cutoff voltage applied to the gate electrode 32, the depletion layer 46 spreads into the N− type semiconductor layer 12 enough to occupy substantial portions thereof until its opposite ends are connected to each other as shown in FIG. 3C.

Figure 4:
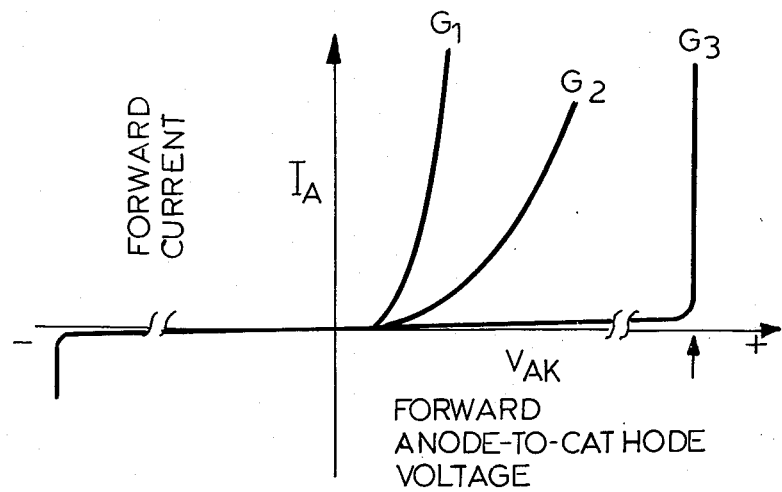
FIGS. 4 and 5 are graphs illustrating the performance characteristics of the present invention in the different modes of operation.

FIG. 4 is a graph illustrating the characteristics of the arrangement as shown in FIG. 1. In FIG. 4, the forward current $I_A$ is plotted in the ordinate against a the forward voltage $V_{AK}$ applied across the anode electrode 28 and the cathode electrode 26 in abscissa with the gate voltage $V_{GK}$ applied across the gate electrode 32 and the cathode electrode 26 being used as a parameter. Curve $G_1$ is the characteristic curve when the gate electrode 32 is maintained open as shown in FIG. 3A and curve $G_2$ is the characteristic curve when the gate electrode 32 has applied thereto a voltage less than the cutoff voltage as described in conjunction with FIG. 3B. With the anode-to-cathode voltage $V_{AK}$ remaining unchanged, the characteristic curve $G_1$ is higher in forward current than the characteristic curve $G_2$. If the cutoff voltage is applied to the gate electrode 32 as above described in conjunction with FIG. 3C, then a characteristic curve $G_3$ results. From the characteristic curve $G_3$ it is seen that the forward current $I_A$ is controlled to the very low current level restricted by a space charge existing in the channel 42 and that the forward current is substantially blocked within a region of voltages less than the breakdown voltage $V_B$ for the arrangement. Under these circumstances, a luminescent output is zero.

Figure 5:
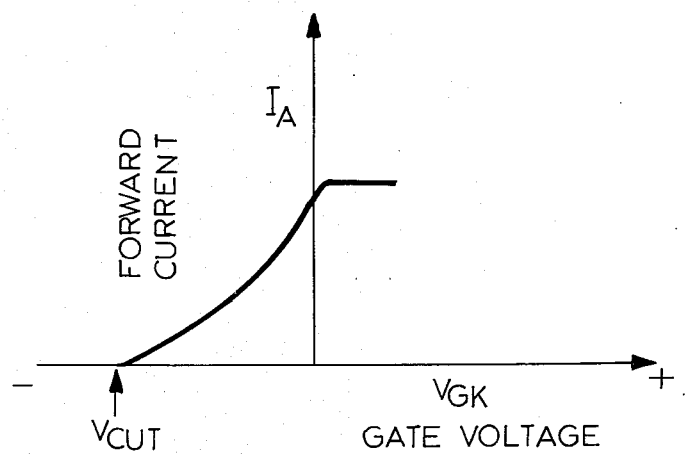

FIG. 5 shows the forward current $I_A$ plotted in ordinate against the gate voltage $V_{GK}$ in abscissa with the forward anode-to-cathode voltage $V_{AK}$ remaining unchanged.

From FIG. 5, it is seen that, as the voltage at the gate electrode 32 relative to the cathode electrode 26 becomes increasingly negative, the forward current $I_A$ is gradually decreased until it becomes substantially zero at the cutoff voltage.

From the foregoing it will readily be understood that the luminescent output can be continuously controlled by the magnitude of the gate voltage.

Figure 6A:
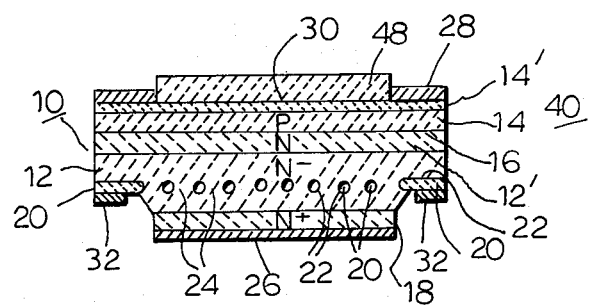
FIG. 6A is a longitudinal sectional view of a semiconductor controlled luminescent element constructed in accordance with the principles of the present invention.
Figure 6B:
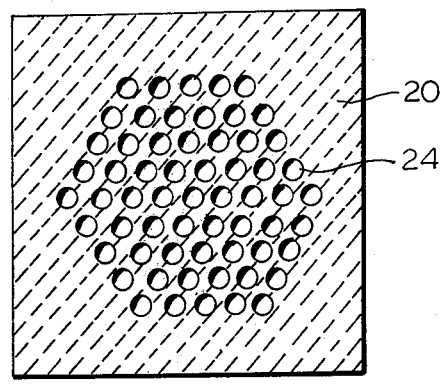
FIG. 6B is a transverse sectional view of the shape of the semiconductor gate layer shown in FIG. 6A.
Figure 6C:
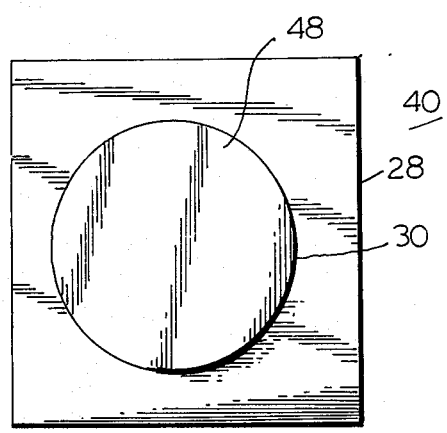
FIG. 6C is a plan view as viewed from the side of the anode electrode shown in FIG. 6A.

Referring now to FIG. 6, there is illustrated a semiconductor controlled luminescent element constructed in accordance with the principles of the present invention having a semiconductor gate layer buried therein. FIG. 6A is a longitudinal sectional view of a semiconductor chip having a controlled luminescent element constructed therein, FIG. 6B is a transverse sectional view of the semiconductor gate layer buried in the chip with the section taken in a plane parallel to the main face of the chip, and FIG. 6C is a plan view of the element as viewed from the anode side.

In order to produce the semiconductor controlled luminescent element as shown in FIG. 6, a substrate 18 of semiconductive material, in this case, gallium arsenide (GaAs) is first prepared having an N+ type conductivity and a high impurity concentration of $10^{19}$ atom per cubic centimeter or more. Then gallium arsenide (GaAs) is epitaxially grown on one of the main faces, in this case, the upper main face as viewed in FIG. 6A of the substrate 18 from the gaseous phase to form an N− type semiconductor layer 12 having a low impurity concentration of from $10^{15}$ to $10^{16}$ atoms per cubic centimer for example and therefore a high resistivity. A material suitable for forming a diffusion mask, for example, a mixture of silicon oxide and silicon nitride ($SiO_2$-$Si_3N_4$) is deposited on the exposed surface of the layer 12 in the manner well known in the art after which the deposited film is subjected to photolithographic and etching techniques to leave a plurality of mask portions at the positions where channel portions 24 are to be formed in the later steps as shown by circles in FIG. 6B.

Then zinc (Zn) is diffused into the surface of the layer 12 with the mask portions left thereon to form a semiconductor gate layer 20 having a central reticulated portion on the layer 12 as shown at the hatched portion in FIG. 6B. The semiconductor gate layer 20 has a P+ type conductivity and a high impurity concentration of, for example, $10^{19}$ atoms per cubic centimeter or more. After the removal of the diffusion mask portions, gallium arsenide is again epitaxially grown on the entire surface of the N− type semiconductor layer 12 according to gas growth technique to form an N− type semiconductor layer to thereby bury the gate layer 20 forming gate PN junction 22 within the N− type semiconductor layer which are connected to each other and to simultaneously form a plurality of channel portions 24 within the reticulated gate layer 20. The latter grown layer is also designated by the reference numeral 12 and has an impurity concentration of from $10^{15}$ to $10^{16}$ atoms per cubic centimeter and the channel portions 24 are in the form of circles about 100 microns in diameter.

Then a solution growth technique is used to grow an N type semiconductor layer 12' of gallium arsenide (GaAs) suitably doped with silicon (Si) on the N− type semiconductor layer 12 after which a P type gallium arsenide layer 14 suitably doped with silicon is similarly grown an the N type semiconductor layer 12' to form therebetween a luminescent PN junction 16 for producing luminescence. The N type layer 12' has an impurity concentration of from about $10^{17}$ to $10^{18}$ atoms per cubic centimeter and the P type layer 14 has an impurity concentration of about $10^{18}$ atoms per cubic centimeter.

Subsequently zinc (Zn) is diffused into the surface of the P type semiconductor layer 14 to a predetermined depth to form a P+ type semiconductor layer 14' having a high impurity concentration of about $10^{19}$ atoms per cubic centimeter. The P+ type layer 14' forms a semiconductor layer on the anode side or a semiconductor anode layer.

Also the other main face of the substrate 18 is lapped to decrease its thickness to a predetermined magnitude in order to improve the electrical and thermal resistance of the resulting element.

In FIG. 6A the reference numeral 18 designates the N+ type semiconductor layer after lapping which forms a semiconductor layer on the cathode side or a semiconductor cathode layer.

Then the periphery of the N+ type semiconductor cathode or the substrate layer 18 is etched away into a mesa-shape until the P+ type semiconductor gate layer 20 is exposed to the outer peripheral portion of the etched surface of the N− type semiconductor layer 12.

Following this, a gold-zinc alloy (Au-Zn) is vapor deposited on predetermined surface portions of the P+ type semiconductor layer 14' on the anode side under a vacuum while a gold-germanium alloy (Au-Ge) is similarly vapor deposited on a predetermined surface portion of the N+ type semiconductor layer 18 on the cathode side. The vacuum vapor desposited alloys are sintered to form an anode electrode 28, a gate electrode 26 and a cathode electrode 32 on the associated semiconductor layers. The anode electrode 28 includes a central window 30 in the form of a circle as shown in FIG. 6C.

Then the electrodes 26, 28 and 32 are electrically connected to respective external lead (not shown) by any suitable bonding means. Finally the resulting structure is encapsuled in a transparent molding. Alternatively it may be hermetically housed in a casing including an optical lens.

A multiplicity of luminescent elements such as above described in conjunction with FIG. 6 can be simultaneously formed on a single wafer of semiconductive material. In this case, a diamond scriber is used to divide the wafer into individual luminescent elements followed by encapuling.

The semiconductor controlled luminescent element doped with silicon as above described is responsive to a forward current flowing from the anode 28 to the cathode electrode 26 to emit infrared radiation having a peak at a wavelength of about 9,400 Å.

The sensing of this infrared radiation is accomplished by using any suitable light-receiving element formed of silicon or the like because it can not be sensed by the naked eye. The optical coupling between such a luminescent element and a light-receiving element is known as a photocoupler and is useful for purposes of insulating electric circuits from each other and so on.

Infrared radiation may be converted to visible radiation through the utilization of rare earth phosphors well known in the art in order to sense infrared radiation by the naked eye. The luminescent element 40 shown in FIGS. 6A and 6B includes suitable rare earth phosphor 48 fitting the window 30. Therefore infrared radiation emitted adjacent to to the PN junction 16 and having a peak at a wavelength of about 9,400 Å is absorbed by the phosphor 48 and converted to visible radiation.

Examples of phosphors for converting infrared radiation to visible radiation include fluorides and oxychlorides of rare earth elements including a sensitizer and an activator. A preferred phosphor includes essentially a lanthanum fluoride (LaF), yttrium fluoride (YF$_3$) or yttrium oxychloride (Y$_3$OCl$_7$) having, as a sensitizer and an activator, a small amount of ions of a rare earth element such as ytterbium ions (Yb$^{3+}$), erbium ions (Er$^{3+}$), thulium ions (Tm$^{3+}$) or holumium ions (Ho$^{3+}$) added thereto. Any of those phosphors can be coated on the P+ type semiconductor layer 14' which is the luminescent surface by means of any suitable transparent binder such as silicon resin.

Particularly a phosphor formed of yttrium oxychloride (Y$_3$OCl$_7$) and ytterbium ions (Yb$^{3+}$) emits light having a color continuously changed from green through, yellow, orange and thence to red as the excitation infrared radiation increases in intensity. Therefore the use of that phosphor is advantageous in that, by controlling the magnitude of the reverse gate voltage, not only the extinction and emission of light can be controlled but also the color of the emitted light can be controlled.

In order to permit the gate voltage to terminate the emission of light, the channel must be formed to enable it to be pinched off as shown in FIG. 3C. Therefore it is required to preliminarily chase the impurity concentration of the N− type semiconductor layer 12 and the diameter of the channel portions 24 so as to permit the channel portions 24 to be pinched off with a voltage less than the breakdown voltage for the gate junction 22.

Figure 7A:
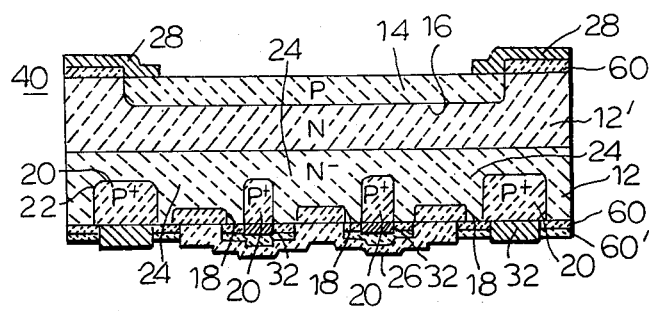
FIGS. 7A and 7B are views similar to FIGS. 6A and 6B respectively but illustrating a modification of the present invention.
Figure 7B:
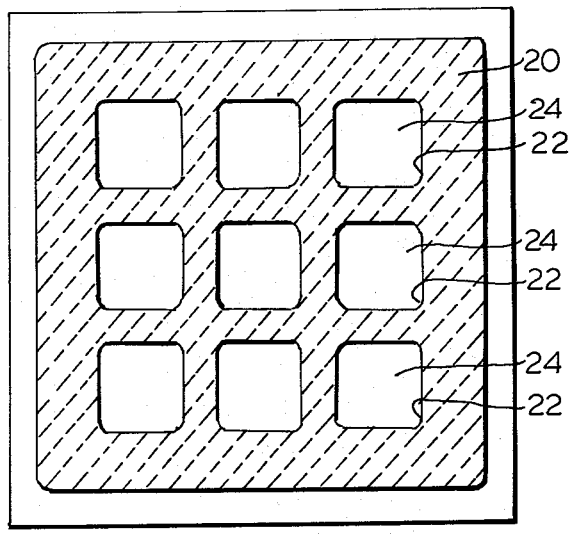

FIG. 7 shows a modification of the present invention applied to the planar type construction FIG. 7A is a longitudinal sectional view, and FIG. 7B is transverse sectional view of a P+ type semiconductor gate layer illustrating an array of channel portions.

The description will now be made by way of example, on the assumption that gallium arsenide (GaAs) is used as a semiconductive material in a planar type controlled luminescent element.

An N− type substrate 12 of gallium arsenide (GaAs) is first prepared having a high resistivity or a low impurity concentration and then an N type semiconductor layer 12' suitably doped with silicon (Si) is expitaxially grown on one of the main faces, in this case, the upper main face as viewed in FIG. 7A of the substrate 12 from either the liquired or gaseous phase. Then the other main face of the N− type substrate 12 is lapped to decrease its thickness to a predetermined magnitude. Subsequently an electrically insulating film 60 is disposed on each of the exposed surfaces of the N type semiconductor layer 12' and the N− type semiconductor substrate 12 by depositing silicon oxide (SiO$_2$) and silicon nitride (Si$_3$N$_4$) thereon according to the chemical vapor deposition technique. This insulating film 60 also serves as a diffusion mask. To this end, photolithographic and etching techniques are used to remove those portions of the insulating films 60 where a P type semiconductor anode layer 14 and a P+ type semiconductor gate layer 20 are to be formed in the subsequent step. The removed portion of the insulating film 60 is reticulated as shown at the hatched portion in FIG. 7B.

Thereafter zinc (An) is diffused into both the N type semiconductor layer 12' and the N− type semiconductor substrate 12 through the respective diffusion masks 60 to form both the P type semiconductor layer 14 contiguous to the N type semiconductor layer 12' and the reticulated P+ type semiconductor layer 20 contiguous to the N− type semiconductor substrate 12. At the same time, a luminescent PN junction 16 is formed between the N type layer 12' and the P type layer 14 while gate PN junctions 22 are formed between the N− type substrate and the reticulated P type layer 20 and a plurality of channel portions 24 are formed within and encircled by the reticulated P+ type layers 20.

As in the arrangement of FIG. 1, the P type layer 14 forms a semiconductor layer on the anode side or a semiconductor anode layer and the P+ type layer 20 forms a semiconductor layer on the gate or a semiconductor gate layer. The PN junction 16 produces to the luminescence.

In order to form an N+ type semiconductor layer 18 forming a semiconductor cathode layer divided into a plurality of semiconductor portions, a donor type impurity such as sulfur (S), tellurium (Te), cadmium (Cd) or the like is introduced into one portion of surfaces of the channel portions 24 encircled by the reticulated semiconductor gate layer 20 according to the ion implantation technique followed by annealing. The resulting N+ type cathode layer 18 has a low resistivity or a high impurity concentration.

The arrangement of FIG. 7 is of the so-called planar type and different from that shown in FIG. 6 only in that in FIG. 7 the PN junction 16 has an end surface exposed to the main surface of the N+ type semiconductor layer 14' and the lower main face of the N− type substrate 12 respectively and masked by the insulating film 60 formed of silicon oxide (SiO$_2$) and silicon nitride (Si$_3$N$_4$) and that the reticulated gate layer 20 is exposed to the lower main face of the substrate 12 and therefore those portions of the N+ type layer 18 contacted by the channel portions 24 are spaced apart from one another by the reticulated gate layer 20. It will be readily understood that the N+ type semiconductor layers 18 form a semiconductor cathode layer divided into a plurality of portions.

An anode electrode, a cathode electrode and a gate electrode are disposed in ohmic contact with associated portions of the arrangement as shown in FIG. 7 in the manner as above described in conjunction with FIG. 6 to complete a semiconductor controlled luminescent element. More specifically any suitable metallic material capable of ohmic contact with semiconductors, for example, a gold-germanium alloy (Au-Ge) and a gold-zinc alloy (Au-Zn) is vapor deposited on the respective exposed surfaces of the gate layer 20 and the N+ type cathode layer 18 under a vacuum. After predetermined portions of the vapor deposited metallic film are removed by photolithographic and etching techniques, the lower main face of the substrate 12 is coated with an electrically insulating film 60' composed, for example, of silicon oxide ($SiO_2$) in a manner well known in the art. Photolithographic and etching technique are also used to form contact holes for the cathode electrode 26 and the gate electrode 32 in the insulating film 60'. It is noted, however, that no contact hole is formed in those portions of the insulating film 60' underlaid with the reticulated gate layer 20 between the cathode layers 18. Then a metallic material such as gold (Au) is again vapor deposited on the insulating film 60' and the contact holes to electrically interconnect the spaced cathode electrodes 26 through the vapor deposited metallic material disposed on the insulating film 60'.

Following this, photolithographic and etching techniques are also used to separate and electrically insulate the interconnected cathode electrode 26 from the gate electrodes 32 as shown in FIG. 7A.

The insulating film 60 disposed on the anode layer 14 is similarly provided with a contact hole and then a metallic material such as gold-zinc alloy (Au-Zn) or aluminum (Al) is evaporated on both the insulating film 60 and the anode layer 14 under a vacuum. Thereafter the metallic layer thus vapor deposited is provided with a central window 30 according to photolithographic and etching techniques. This window 30 is shown in FIG. 7A and serves to permit external radiation of the light emitted adjacent to the PN junction 16.

Subsequently the resulting structure is encapsuled in any suitable casing as above described in conjunction with FIG. 6.

In the arrangement as shown in FIG. 7, the reticulated semiconductor gate layer 20 is exposed to the main face on the cathode side but the reticulated channel 24 can change in cross sectional area in response to the reverse voltage applied across the gate and cathode electrodes to control the channel current flowing through between the anode and cathode electrode and therefore the luminescent output.

While the gate electrode 32 is shown in FIGS. 6 and 7 as being disposed on the side of the cathode electrode 26 it is to be understood that it may be disposed on the side of the anode electrode 28. In the latter case, it is required to lead light emitted adjacent to the luminescent PN junction 16 to that surface of the luminescent element on the anode side by isolating the reticulated gate layer or layer 20 from the PN junction 16.

Instead of the gate layer 20 being contiguous to the N− type semiconductor layer 12, it may be disposed within a P type semiconductor layer while the channel is disposed in the latter to thereby control a luminescent output. Further if desired, the gate layer may be disposed within each of the N and P type semiconductor layers to control a luminescent output by a pair of gate electrodes disposed in ohmic contact with both gate layers.

Figure 8:
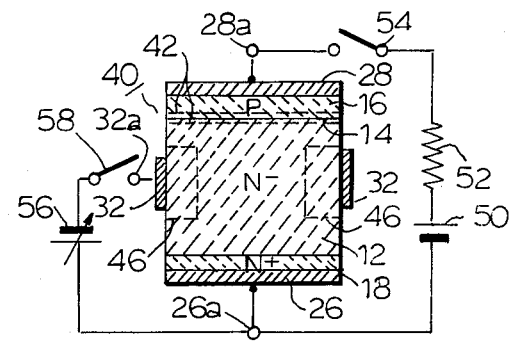
FIG. 8 is a view similar to FIG. 1 but illustrating another modification of the present invention.

While the present invention has been illustrated and described in conjunction with the control of a luminescent current effected by controlling the depletion layer with a reverse voltage applied across the gate junction it is to be understood that the control of the luminescent output may be accomplished by utilizing a depletion layer resulting from a Schottky barrier as shown in FIG. 8.

The arrangement illustrated in FIG. 8 is different from that shown in FIG. 1 principally in that in FIG. 8 the gate electrode 32 is composed of a metallic material suitable for forming a Schottky barrier (not shown) adjacent to the gate electrode to thereby form a depletion layer 46 with the semiconductor gate layer omitted. Also it is noted that the anode electrode 28 includes no window and that light emitted adjacent to the luminescent PN junction 16 is externally radiated through lateral surfaces of the element 40.

Figure 9A:
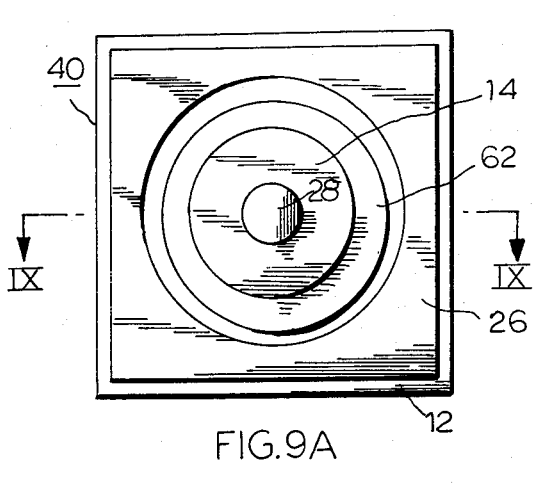
FIG. 9A is a plan view of still another modification of the present invention.
Figure 9B:
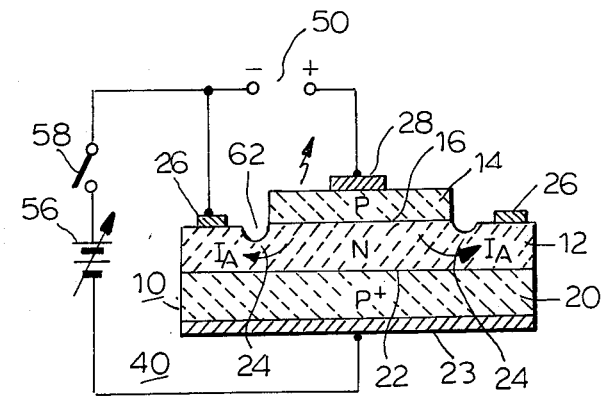
FIGS. 9B, 9C and 9D are longitudinal sectional views as taken along the line IX-IX of FIG. 9A illustrating in the different modes of operation.
Figure 9C:
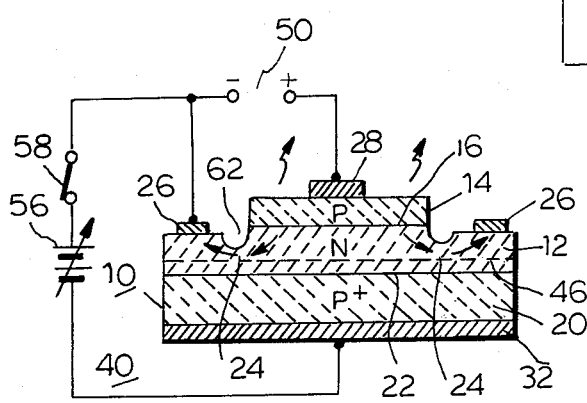
Figure 9D:
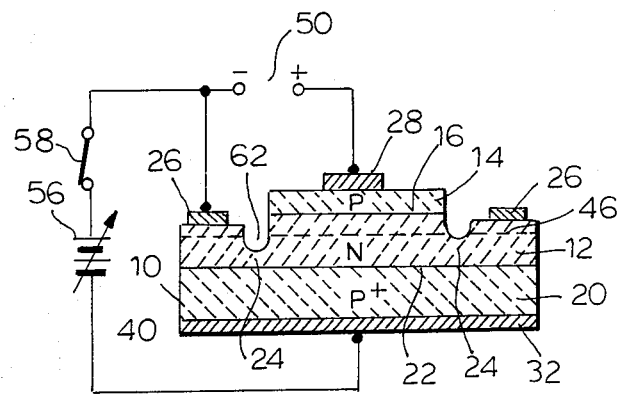

FIG. 9A is a plan view of still another modification of the present invention and FIGS. 9B, 9C and 9D are longitudinal sectional view as taken along the line IX—IX of FIG. 9A illustrated in the different modes of operation.

The arrangement illustrated will now be described in conjunction with a semiconductor substrate and semiconductor layers disposed thereon formed of gallium phosphide (GaP). A semiconductor substrate formed of gallium phosphide (GaP) is suitably doped with sulfur (S) or tellurium (Te) to form an N type semiconductor cathode layer 12 having an impurity concentration of from $10^{17}$ to $10^{18}$ atoms per cubic centimeter and includes one of the opposite main faces, in this case, the upper main face as viewed in FIG. 9B, having disposed on the central portion thereof a P type semiconductor anode layer 14 suitably doped with zinc (Zn) and having an impurity concentration of from $10^{18}$ to $10^{19}$ atoms per cubic centimeter and a thickness of about 20 microns. The N type cathode layer 12 and P type anode layer 14 has a luminescent PN junction 16 formed therebetween. Then a P+ type semiconductor gate layer 20 is disposed on the entire are of the main lower face of the N type cathode layer 12 to form a gate PN junction 22 substantially parallel to the luminescent PN junction 16. The P+ type gate layer 20 is suitably doped with zinc and has an impurity concentration of from $10^{19}$ to $10^{20}$ atoms per cubic centimeter and a thickness of about 200 microns.

Then an anode electrode 28 formed of a gold-zinc alloy is disposed in ohmic contact with the central portion of the P type anode layer 14 and an apertured cathode electrode 26 formed of a gold-germanium alloy is disposed in ohmic contact with the entire peripheral portion of the N type cathod layer 12. Also a gate electrode 32 formed of a gold-germanium alloy is disposed in ohmic contact with the P+ type gate layer 20 at the entire area.

Further an annular groove 62 dug in the N type cathode layer 12 encircles the P type anode layer 14 and exposes the periphery of the luminescent PN junction 16. Thus that portion of the N type cathode layer 12 located between the annular groove 62 and the luminescent PN junction 16 is thiner about 15 microns than that portion of the layer 12 disposed between the luminescent junction 16 and the gate PN junction 22. Formed in this thiner portion of the N type cathode layer 12 is a channel region 24 running parallel to the surface of the N+ type cathode layer 12. The forward current from the anode electrode 28 flows into the cathode electrode 26 through the channel region 24.

As shown in FIGS. 9B, 9C and 9D, a main source of direct current 50 is connected across the anode electrode 28 and the cathode electrode 26 to cause a current to flow from the anode electrode to the cathode electrode and a variable source 56 of direct current is connected across the cathode electrode 26 and the gate electrode 32 through a switch 58 to permit the gate junction 22 to be reversely biased.

The channel region 24 has a thickness dependent upon both the depth of the groove 62 and the reverse bias voltage of the gate junction 22. In order to completely control the forward current flowing through the channel region 24, it is required that, upon applying a cut off reverse voltage across the gate PN junction, the end surface of the depletion layer shown at broken line 46 in FIGS. 9C and 9D spreads in the N type cathode layer 12 enough to reach the bottom of the groove 62. This spread of the depletion layer depends upon both the reverse voltage applied across the gate PN junction 22 and the resistivity of the N type cathode layer 12. Thus the higher this resistivity the more the spread of the depletion layer will be if the reverse voltage remains unchanged. Also the P+ type gate layer 20 to preferably has a low resistivity.

The controlled luminescent element as above described and generally designated by the reference numeral 40 in FIG. 9 may be produced as follows: The N type cathode layer 12 and the P type anode layer 14 are epitaxially grown on a P+ type substrate of gallium phosphide (GaP) from the liquid phase one by one and this P type anode layer 14 is removed from the peripheral portion in a manner well known in the art to expose the N type cathode layer. Then the annular groove 62 is cut in the peripheral portion of the luminescent PN junction 16 formed between the P type anode layer 14 and the N type cathode layer 12 by a selective etching technique. Thereafter an anode electrode 28, a cathode electrode 26 and a gate electrode 32 are disposed in ohmic contact with the P type anode layer 14, the N type cathode layer 12 and the P+ type gate layer 20, respectively, in a manner well known in the art.

It is assumed that, as shown in FIG. 9B, a forward voltage on the order of 2.5 volts from the main source 50 is applied across the anode and cathode electrodes to render the anode electrode 28 positive with respect to the cathode electrode 26 while the switch 58 is maintained in its open position. Under these conditions, a forward current from the main source 50 flows through the anode electrode 28, the luminescent PN junction 16, the channel region 24 and thence to the main source through the cathode electrode as shown by the arrow $I_A$ in FIG. 9B thereby emitting light adjacent to the luminescent PN junction 16. This light is radiated externally through that portion of the surface of the P type anode layer 14 encircling the anode electrode 28. The preferred current has a magnitude as determined by the forward voltage applied across the anode electrode 28 and cathode electrodes 26 as in conventional semiconductor luminescent diodes. The resulting light has an output L expressed by $L\alpha I_A{}^m$ where $I_A$ designates the forward current and m designates a constant having a value of from 1.0 to 1.5 determined by a current density and the like. For a forward current of 100 milliamperes for example, the luminescent output can be ideally on the order of several milliwatts but normally in many cases is from 0.5 to 1.0 milliwatt.

Then it is assumed that, as shown in FIGS. 9C and 9D, the switch 58 is brought into its closed position to apply a gate voltage from the source 56 across the gate electrode 32 and the cathode electrode 26 rendering the cathode electrode 26 positive with respect to the gate electrode 32. Under these conditions when the gate voltage from the source 58 is gradually increased from zero to about 100 volts, the depletion layer originating from the gate PN junction 22 gradually spreads in both the N type cathode layer 12 and the P+ type gate layer 20 until the gate voltage reaches a specified voltage at which the voltage causes avalanche breakdown of the gate PN junction 22.

The channel region 24 has a thickness small enough to permit the end surface 46 of the depletion layer spread in the N type cathode layer 12 to reach the bottom of the groove 62 with a reverse gate voltage less than the specified voltage causing the avalanche breakdown of the gate PN junction 22. Under these circumstances, the forward current flowing from the anode electrode 28 to the cathode electrode 26 through the P type anode layer 14 and the N type cathode layer 12 is cutoff by the depletion layer filling the channel region 24 as shown in FIG. 9D. The term "cutoff voltage" used herein means the minimum reverse voltage required for the forward current to be cut off.

In FIG. 9C broken line 46 designates the end surface of the depletion layer spread in the N type cathode layer 12 with a reverse voltage less than the cutoff voltage applied to the gate electrode 32 and the arrow $I_A$ designates the forward current.

The forward current $I_A$ as above described in conjunction with FIGS. 9B, 9C and 9D has the characteristic curves such as shown in FIGS. 4 and 5 as already described.

From the foregoing it is seen that in FIG. 9 the spread of the depletion layer within the channel region 24 is changed to vary the cross sectional area of the current passageway through which the forward current flows thereby to change an impedance of the circuit for the forward current. Thus it is possible to control the forward current with the magnitude of the voltage across the gate source 56 to control the luminescent output from the controlled luminescent element 40.

Figure 10:
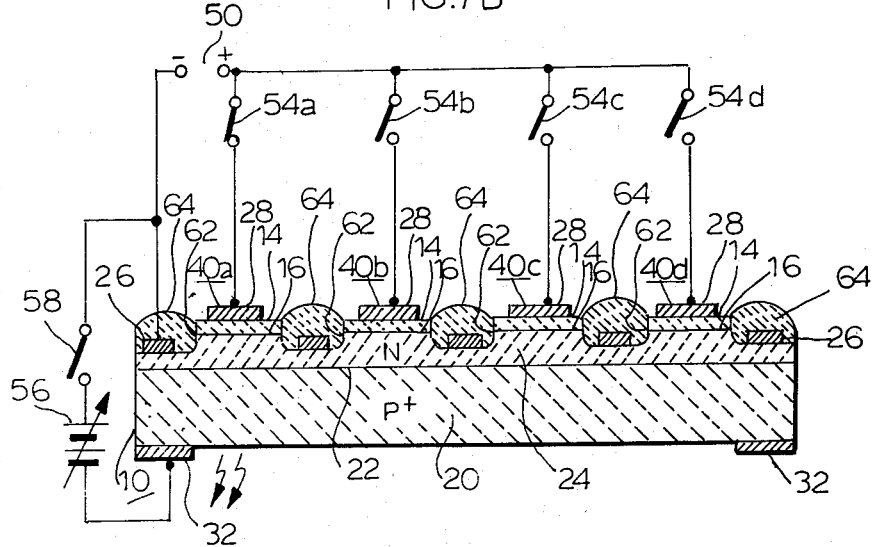
FIG. 10 is a longitudinal sectional view of a different embodiment of the present invention.

FIG. 10 shows another modification of the present invention. The arrangement illustrated comprises an array of controlled luminescent elements generally designated by the reference numeral 100 and including a plurality, in this case, four of controlled luminescent elements 40a, 40b, 40c and 40d disposed in a laterally aligned relationship in a single wafer formed of gallium phosphide (GaP). More specifically, a single N type cathode layer 12 is disposed on one of opposite surfaces, in this case, an upper surface as viewed in FIG. 10 of a single P+ gate layer 20 to form a single gate PN junction 22 and four P type anode layers 14a, 14b, 14c and 14d are disposed in spaced, laterally aligned relationship on the other or upper surface of the N type cathode layer 12 to form respective luminescent PN junctions 16a, 16b, 16c and 16d therebetween. A groove 62 such as above described in conjunction with FIG. 9 is disposed between each pair of adjacent P type anode layers on the upper surface of the N type cathode layer 12 to space the luminescent PN junctions away from one another while forming respective channel regions 24 between the bottoms thereof and the opposite portions of the gate PN junction 22. Also a similar groove 62 is disposed on the outside of each of the outermost P type anode layers 14a and 14d to form a channel region 24 between its bottom of and the opposite portion of the gate PN junction 22. These channel regions 24 run parallel to the surface of N type cathode layer 12.

A gate electrode 32 is disposed in ohmic contact with the P type gate layer 20 and has a central large window 30 through which light emitted adjacent to the respective luminescent PN junctions 16 can be externally radiated. A cathode electrode portions designated by the reference numeral 26 are disposed in ohmic contact with the N type cathode layer 12 at the bottoms of the respective grooves 62 and interconnected to be common to all the controlled luminescent elements 40a, 40b, 40c and 40d. However a plurality in this case four of anode electrodes 28a, 28b, 28c and 28d are disposed in ohmic contact with the respective P type anode layers 14a, 14b, 14c and 14d.

Each groove 62 cooperates with a block of black resin 64 filling the groove to prevent light emitted by any of the controlled luminescent elements from escaping to the adjacent element emitting no light.

The anode electrodes 28a, 28b, 28c and 28d are connected via individual switches 54a, 54b, 54c and 54d to a positive side of the main source of direct current 50 having its a negative side connected to the common cathode electrode 26. The gate electrode 32 is connected to the negative side of the gate source 56 of direct current 56 having its positive side connected to the cathode electrode 11 through a switch 58.

In order to emit light from any desired one of the controlled luminescent element, for example, the element 40a, only the associated switch or the switch 54a is closed to apply a forward voltage across the anode electrode 26 and the cathode electrode 26 while the gate switch 58 is maintained in its open position. Alternatively the gate switch 58 may be closed to apply a voltage less than the cutoff voltage to the gate electrode 32 as above described.

The luminance of the light emitted by the controlled luminescent element can be controlled only by closing the gate switch 58 to increase the voltage applied to the gate electrode from its null magnitude and in a negative direction to the cutoff voltage. Therefore the luminance can be controlled by the voltage applied to the gate electrode without changing either the voltage across the main source or an impedance in the main circuit.

Thus it is seen that light emitted from each element can be controlled by controlling the gate voltage with the anode electrode maintained at a fixed voltage. Accordingly, the array of controlled luminescent elements 100 can be selectively operated in the different luminescent modes to display many pieces of information.

If desired, the array 100 may include more than four of the controlled luminescent elements.

While the arrangement of FIG. 10 has been described to radiate light through the surface of the P+ type gate layer 20 it is to be understood that the light may be radiated through the surface of the P type anode layers 14 as in the arrangement as shown in FIG. 1.

From the foregoing it is seen that the present invention is characterized in that a semiconductor wafer including an injection type luminescent element such as a PN junction is provided with an operating region performing the operation resembling that of a field effect transistor thereby to effect control of the luminescent output with a gate voltage for the operating region.

The present invention has several advantages. For example, the controlled luminescent element of the present invention can not only control the emission and extinction of light with a gate voltage but also can modulate the luminescent output with a gate signal and at a high speed. Also, by applying any suitable phosphor to the element, the color of light emitted therefrom can be varied. Further the control requires only low electrical power and the associated control circuit simple because the gate current scarcely flows through the controlled luminescent element. These advantages are not found in the prior art practice. Therefore the present invention is useful for display lamps, light sources for communication and elements for displaying images.

In addition, by spacing the channel forming portion away from the portion contributing to the emission of light, a reverse voltage withstandable by the gate layer and the gate control characteristic can comprise with the luminescent characteristics, or an luminescent output and an efficiency of luminescence.

While the present invention has been illustrated and described in conjunction with a few preferred embodiments thereof it is to be understood that numerous changes and modifications may be resorted to without departing from the spirit and scope of the present invention. For example, instead of the groove 62 as shown in FIG. 9, a P+ type semiconductor layer similar in shape to the groove 62 may be disposed to form the channel region. This eliminates the necessity of providing the P+ type gate layer 20 because the gate electrode can be disposed in ohmic contact with the P+ type semiconductor layer just described. It is essential that the P+ type semiconductor layer be formed between the anode and cathode electrodes disposed in parallel relationship so as to change the cross sectional area of the channel region providing the passage through which the forward current flows. Further the position of the light radiating surface through which light emitted adjacent to the luminescent PN junction 16 is externally radiated is not restricted to the positions shown in each of the embodiments as above described but the light radiating surface may be located on the front or rear surface of a semiconductor substrate involved or a lateral surface.

Further the various semiconductor layers may have their conductivity reversed from that illustrated with the polarity of the sources of direct current changed correspondingly.

Also while the present invention has be described in conjunction with the use of gallium arsenide (GaAs) and gallium phosphide (GaP) as the semiconductive material it is to be understood that the invention is not limited thereby and that, for practicing the present invention, the semiconductive material may be selected from the group consisting of gallium antimonide (GaSb), gallium arsenide-phosphide (GaAs$_{1-x}$P$_x$ where x has a value greater than zero and less than one), gallium-aluminum arsenid (Ga$_{1-x}$Al$_x$As where x has a value greater than zero and less than one), indium-gallium phosphide (In$_{1-x}$Ga$_x$P where x has a value greater than zero and less than one), silicon carbide (SiC) and gallium nitride (GaN). Where it is difficult to form a P type semiconductor layer in the particular semiconductive material such as gallium nitride (GaN), the PN junction may be replaced by any one of the P-N, N-I and P-I-N junctions. In the latter case an N+ type gate region may be disposed in an i layer whereby the channel current or the principal current and therefore the luminescent output can be controlled.

What is claimed is:

1. A semiconductor controlled luminescent device comprising a semiconductor substrate including:
   a P type region and an N type region forming a luminescent PN junction for producing luminescence when a forward current flows therethrough;
   an anode electrode disposed in ohmic contact with said P type region;
   a cathode electrode disposed in ohmic contact with said N type region;
   a control region disposed adjacent to one of said P type region and said N type region and having a conductivity type opposite the region adjacent to which it is disposed for forming a control PN junction therewith and having a shape for defining a current passageway for said forward current of said luminescent PN junction and for producing a depletion layer in said current passageway when a reverse voltage is applied across said control PN junction the size of which depletion layer is determined by the magnitude of said reverse voltage, whereby the magnitude of said current passageway is controlled by controlling the size of said depletion layer and thus controlling the amount of luminescence; and
   a control electrode disposed in ohmic contact with said control region.

2. A semiconductor controlled luminescent device as claimed in claim 1 wherein said semiconductor substrate is formed of a compound including gallium (Ga).

3. A semiconductor controlled luminescent device as claimed in claim 1 wherein said semiconductor substrate is formed of a semiconductor selected from the group consisting of gallium arsenide (GaAs), gallium phosphide (GaP), gallium antimonide (GaSb), silicon carbide (SiC), gallium nitride (GaN), gallium arsenide-phosphide ($GaAs_{1-x}P_x$ where x has a value greater than zero and less than one), gallium-aluminum phosphode ($Ga_{1-x}Al_xP$ where x has a value greater than zero and less than one), and indium-gallium phosphide ($In_{1-x}Ga_xP$ where x has a value greater than zero and less than one).

4. A semiconductor controlled luminescent device as claimed in claim 1 wherein said luminescent junction comprises a junction selected from the group consisting of a PN junction, a P-I junction, an N-I junction and a P-I-N junction.

5. A semiconductor controlled luminescent device as claimed in claim 1 wherein said control electrode disposed in ohmic contact with said control region forms a Schottky barrier therebetween, and is responsive to a reverse voltage applied thereto to form said depletion region for controlling said magnitude of said current passageway.

6. A semiconductor controlled luminescent device as claimed in claim 1 wherein said control region is reticulated in a plan view thereof and buried in said semiconductor substrate having one exposed portion and said control electrode is disposed in ohmic contact with said exposed portion of said control region.

7. A semiconductor controlled luminescent device as claimed in claim 1 wherein said control region is disposed on one of the main surfaces of said semiconductor substrate according to selective diffusion technique and reticulated in a plan view thereof.

8. A semiconductor controlled luminescent device comprising, in combination, an N type semiconductor cathode layer including a pair of main opposite surfaces, a P type semiconductor anode layer disposed on one portion of one of said main surfaces of said N type semiconductor cathode electrode to form a luminescent PN junction therebetween, a P type semiconductor gate layer disposed on the main other surface of said N type semiconductor cathode layer to face that portion of a current passageway for a flow of forward current through said luminescent PN junction located in parallel relationship with said main surface of said N type semiconductor cathode layer within the latter, said P type semiconductor layer forming a gate PN junction with said N type semiconductor cathode layer, a cathod electrode disposed in ohmic contact with the one main surface of said N type semiconductor cathod layer to encircle said P type semiconductor anode layer to form a predetermined spacing therebetween, an anode electrode disposed in ohmic contact with said P type semiconductor anode layer, a gate electrode disposed in ohmic contact with said P type semiconductor gate layer, and control means for applying a reverse voltage across said gate PN junction to spread a depletion layer in said current passageway to control the forward current flowing through said luminescent PN junction dependent upon said spread of said depletion layer.

9. A semiconductor controlled luminescent device as claimed in claim 8 wherein a groove is disposed on the one main surface of said N type semiconductor cathode layer at its position where said current passageway for the flow of forward current through said luminescent PN junction runs in parallel relationship said main surface of said N type semiconductor cathode layer thereby to narrow said current passageway.

10. A semiconductor controlled luminescent device comprising, in combination, a P type semiconductor anode layer including a pair of main opposite surfaces, an N type semiconductor cathode layer disposed on one portion of one of said main surfaces of said P type semiconductor anode layer to form a luminescent PN junction therebetween, an N type semiconductor gate layer disposed on the main other surface of said P type semiconductor anode layer to face that portion of a current passageway for a flow of forward current through said luminescent PN junction located in parallel relationship with said main face of said P type semiconductor anode layer within the latter, said N type semiconductor layer forming a gate PN junction with said P type semiconductor anode layer, an anode electrode disposed in ohmic onctact with the one main surface of said P type semiconductor anode layer to encircle said N type semiconductor cathode layer to form a predetermined spacing therebetween, a cathode electrode disposed in ohmic contact with said N type semiconductor cathode layer, a gate electrode disposed in ohmic contact with said N type semiconductor gate layer, and control means for applying a reverse voltage across said luminescent PN junction to spread a depletion layer in said current passageway to control the forward current flowing through said luminescent PN junction dependent upon said spread of said depletion layer.

11. A semiconductor controlled luminescent device as claimed in claim 10 wherein a groove is disposed on the one main surface of said P type semiconductor anode layer at its position where said current passageway for the flow of forward current through said luminescent PN junction runs in parallel relationship with said main surfaces of said P type semiconductor anode layer thereby to narrow said current passageway.

* * * * *